United States Patent
Weaver et al.

(10) Patent No.: US 8,136,967 B2
(45) Date of Patent: Mar. 20, 2012

(54) LED OPTICAL LENS

(75) Inventors: Matthew Weaver, Aptos, CA (US);
Yuzuru Takashima, Palo Alto, CA (US)

(73) Assignee: Lumenetix, Inc., Scotts Valley, CA (US)

( * ) Notice: Subject to any disclaimer, the term of this patent is extended or adjusted under 35 U.S.C. 154(b) by 310 days.

(21) Appl. No.: 12/392,897

(22) Filed: Feb. 25, 2009

(65) Prior Publication Data
US 2009/0219716 A1     Sep. 3, 2009

Related U.S. Application Data

(60) Provisional application No. 61/032,987, filed on Mar. 2, 2008.

(51) Int. Cl.
    *F21V 5/04* (2006.01)
(52) U.S. Cl. ........ 362/327; 362/298; 362/299; 362/300; 362/311.02
(58) Field of Classification Search ............... 362/311.2, 362/327–328, 308–309, 311.02, 555, 231, 362/298–302, 304–305; 257/98; 359/726
    See application file for complete search history.

(56) References Cited

U.S. PATENT DOCUMENTS

| | | | | |
|---|---|---|---|---|
| 5,836,676 A | * | 11/1998 | Ando et al. | 362/244 |
| 6,097,549 A | * | 8/2000 | Jenkins et al. | 359/726 |
| 6,639,725 B2 | * | 10/2003 | Masaki et al. | 359/599 |
| 6,896,381 B2 | | 5/2005 | Benitez et al. | |
| 6,953,271 B2 | * | 10/2005 | Aynie et al. | 362/511 |
| 7,111,964 B2 | * | 9/2006 | Suehiro et al. | 362/328 |
| 7,152,985 B2 | | 12/2006 | Benitez et al. | |
| 7,181,378 B2 | | 2/2007 | Benitez et al. | |
| 7,224,537 B2 | | 5/2007 | Choi | |
| 7,244,924 B2 | * | 7/2007 | Kiyomoto et al. | 250/216 |
| 2007/0024990 A1 | | 2/2007 | Paek et al. | |
| 2007/0109952 A1 | | 5/2007 | Jeong et al. | |
| 2007/0268694 A1 | | 11/2007 | Bailey et al. | |
| 2008/0089062 A1 | | 4/2008 | Vennetier et al. | |

FOREIGN PATENT DOCUMENTS

WO        WO-0169300        9/2001

OTHER PUBLICATIONS

International Search Report PCT/US2009/001273 dated Oct. 26, 2009; pp. 1-3.

* cited by examiner

*Primary Examiner* — Robert May
(74) *Attorney, Agent, or Firm* — Perkins Coie LLP

(57) ABSTRACT

An optical lens and method for designing the lens are disclosed. The lens includes a first surface and a second surface. Light emitted from multiple light emitting elements enters the lens through a central section of the first surface. The light can be reflected from a reflective central section of the second surface and/or undergo total internal reflection at an outer ring section of the second surface one or more times before exiting the lens through the outer ring section of the second surface. Upon exiting the lens, the light beam has a predetermined divergence angle and has a fairly uniform color in the far field even if the multiple light emitting elements have different peak wavelengths.

32 Claims, 13 Drawing Sheets

LED OPTICAL LENS

CROSS-REFERENCE TO RELATED APPLICATIONS

This application claims the benefit of U.S. Provisional Application No. 61/032,987, entitled "LED OPTICAL LENS", filed Mar. 2, 2008 and is hereby incorporated by reference.

BACKGROUND

A light emitting diode (LED) typically emits light with a Lambertian pattern such that the emitted light is spread over a large solid angle, rather than focused at a single spot. Consequently, many LED lighting products include an optical focusing mechanism. One common approach is to use a reflector system similar to a standard parabolic aluminized reflector (PAR) lamp or a parabolic cone surrounding the light source, as in a flashlight or a car headlight. The second approach is to use optical grade acrylic plastic refractive lenses. These are solid lenses with side surfaces positioned at angles to the LED that reflect most of the sideward light in the same forward direction as the rest of the light creating a focused beam. These are often referred to as TIR (total internal reflection) lenses.

LED reflector systems typically use aluminum applied through vapor deposition for the reflective surfaces because other more reflective surfaces degrade when exposed to the atmosphere. Generally, these reflector systems tend to be large because the light is aggregated by a single reflector in order to meet cost objectives. In these configurations, an LED array or multiple discrete LEDs are directed into a single light column. In contrast, the refractive lens solutions are more compact, however there are inherent losses associated with transmission of light through the surfaces of the lenses because the surface angles cannot reflect all incoming rays from the Lambertian output of the LEDs. In both cases, optical efficiencies are in the 75-85% range.

The foregoing examples of the related art and limitations are intended to be illustrative and not exclusive. Other limitations of the related art will become apparent upon a reading of the specification and a study of the drawings.

BRIEF DESCRIPTION OF THE DRAWINGS

FIG. 2A is a sectional view of a reflective surface of a lens of the lighting device, taken along lines A-A of FIG. 2.

DETAILED DESCRIPTION

Described in detail below is an apparatus for capturing the light emitted by multiple lighting elements such as light emitting diodes (LED) and re-emitting the light in a predetermined exit beam angle. When two or more LEDs are used that emit at different peak wavelengths, the apparatus effectively mixes the colors of the LEDs to produce a far field beam that has a fairly uniform color with no distinguishable color bands arising from the different wavelength light sources.

Various aspects of the invention will now be described. The following description provides specific details for a thorough understanding and enabling description of these examples. One skilled in the art will understand, however, that the invention may be practiced without many of these details. Additionally, some well-known structures or functions may not be shown or described in detail, so as to avoid unnecessarily obscuring the relevant description. Although the diagrams depict components as functionally separate, such depiction is merely for illustrative purposes. It will be apparent to those skilled in the art that the components portrayed in this figure may be arbitrarily combined or divided into separate components.

The terminology used in the description presented below is intended to be interpreted in its broadest reasonable manner, even though it is being used in conjunction with a detailed description of certain specific examples of the invention. Certain terms may even be emphasized below; however, any terminology intended to be interpreted in any restricted manner will be overtly and specifically defined as such in this Detailed Description section.

Figure 1:
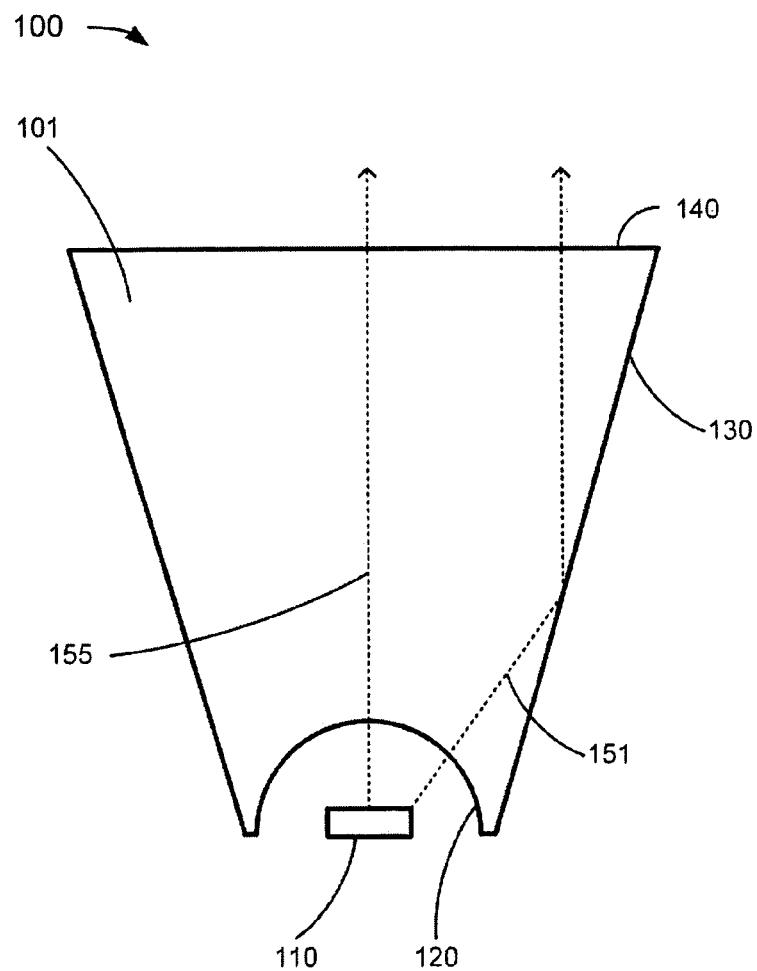
FIG. 1 depicts a cross-section of an example lighting device, according to an embodiment of the disclosure.

FIG. 1 depicts a cross-section of an example lighting device 100, according to an embodiment of the disclosure.

The optical lens 101 is used for capturing the light emitted by one or more light emitting elements 110 including, but not limited to, LEDs and re-emitting the light in a predetermined beam angle. The optical lens 101 is cylindrically symmetrical and is conical along the side surface 130 of the lens. The side 130 is coated with a reflective coating at least at the wavelengths at which the light emitting element 110 emits. In one embodiment, a reflective silver coating can be applied by physical vapor deposition or dipping processes. Other reflective coatings can also be used. Further, the reflective coating on the side 130 is sealable with commonly applied coatings used with mirrors to avoid corrosion without affecting the internal reflective surface.

Light enters the lens 101 from the light emitting element 110 through the inwardly curved surface 120. The inwardly curved surface 120 is either untreated or coated with an antireflective coating at least at the wavelengths at which the light emitting element 110 emits, where the antireflective coating transmits between 98% and 99% of the light.

Light exits the lens 101 from the surface 140 of the lens opposite from the inwardly curved surface. The surface of the lens can be flat or curved, depending on the desired focusing power of the lens. The surface 140 of the lens is either left untreated or is coated with an antireflective coating similar to the one used on the side 130 of the lens in order to improve transmission efficiency.

Light is emitted by the light emitting element 110 in a large solid angle into the curved surface 120 of the lens. Two example light rays are shown traveling through the lens. Light ray 155 travels straight through the surfaces 120 and 140, while light ray 151 reflects off the side of the lens 130 and exits the lens through surface 140.

Figure 2:
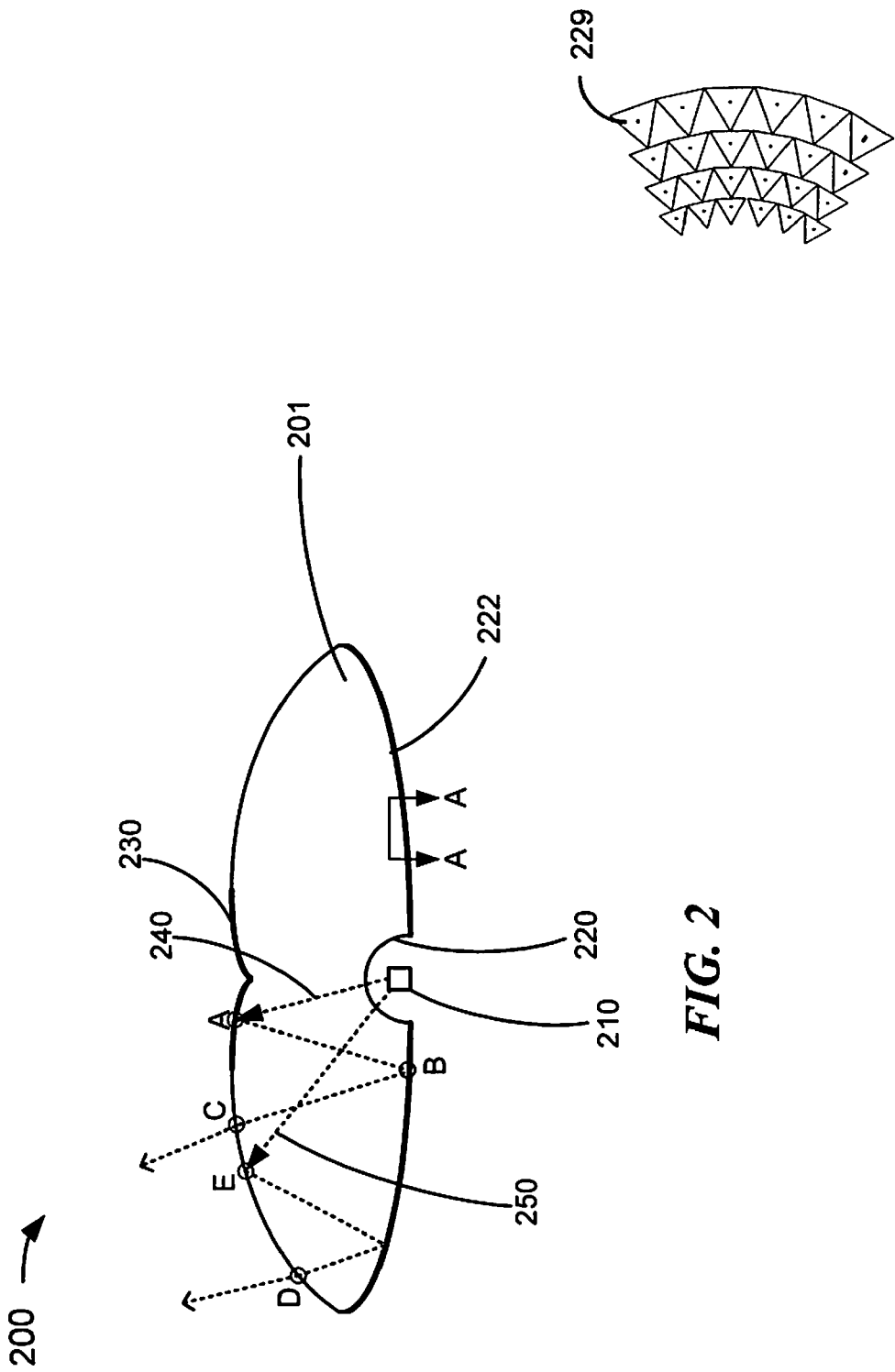
FIG. 2 depicts a cross-section of an example lighting device, according to an embodiment of the disclosure.

FIG. 2 depicts a cross-section of an example lighting device 200, according to an embodiment of the disclosure. The optical lens 201 is flatter and much more compact than lens 101 shown in FIG. 1. The optical lens 201 is designed to be used with multiple light sources, such as LEDs that have different spectral wavelength outputs and are used to tune the 'warmth' of the output of the lighting device. However, an array of different color LEDs emitting into a traditional lens will not result in a far field beam having a uniform color. Thus, one of the design parameters for the optical lens 201 includes color mixing of the individual light sources to produce a fairly uniform far field beam that has substantially no color bands. Other design parameters include: a base lens shape that can be modified to produce a family of lenses that are capable of emitting a beam having a divergence between zero degrees and 60 degrees; a lit appearance (when looking towards the lens and light sources) that does not allow the individual LED colors to be distinguished and produces a uniform glow in all directions; high efficiency (lumens/watt); and a compact, low volume lens size.

The optical lens 201 has two surfaces. For ease of reference, the surfaces are referred to as the bottom surface and the top surface, corresponding to the orientation of the lens shown in the FIG. 2. However, the lens can have any orientation; the bottom surface does not have to face downward, nor does the top surface have to face upward.

Figure 3:
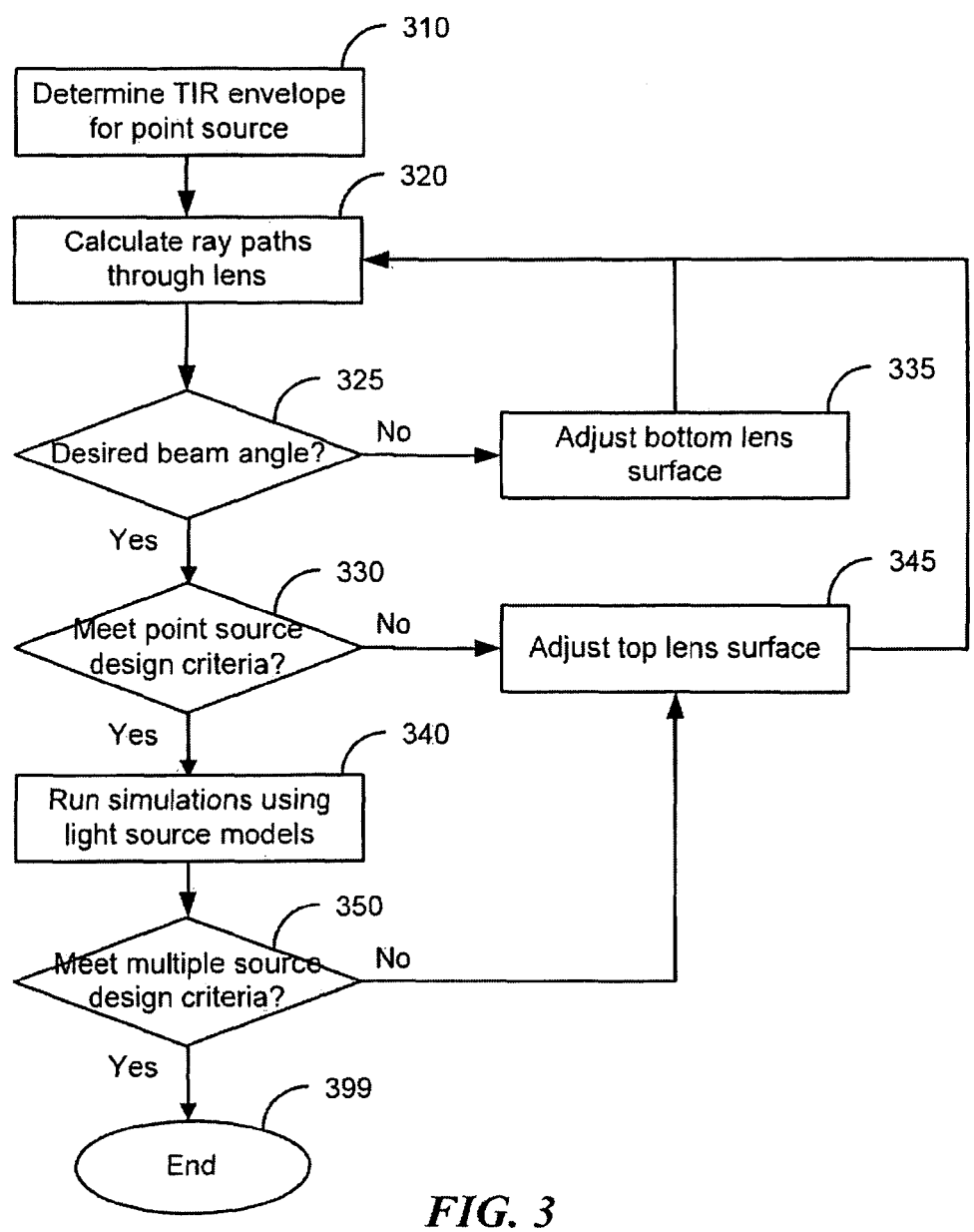
FIG. 3 depicts a flow diagram illustrating a process of designing an optical lens, according to an embodiment of the disclosure.

FIG. 3 depicts a flow diagram illustrating a process 300 of designing an optical lens, according to an embodiment of the disclosure.

A single point source is selected as the initial light source for emitting light into the optical lens to be designed. At block 310, the light rays from the point source are used to determine an envelope profile at which the rays undergo total internal reflection upon intersecting the envelope. Total internal reflection occurs when a ray of light strikes a medium boundary at an angle greater than the critical angle with respect to the normal to the surface. Thus, any lens surface shape below this envelope will also give rise to total internal reflection because the angle of incidence will be greater for the lens surface than for the envelope. The outer ring section 232 of the top surface of the lens in FIG. 2 is an example configuration for which total internal reflection occurs for a light ray emitted by the source 210.

Because of the index of refraction of a typical material used to make the lens is approximately 1.5, there is a central region 230 in the top surface of the lens for which no total internal reflection will occur because the angle for light rays emitted by source 210 is too steep. The central region 230 can be coated with a reflective coating so that any light rays hitting this section will be reflected back into the lens. The central section 230 is shaped with an inwardly tapered notch. This surface is optically designed to reflect light from the emitting source 210 back across the outer ring 222 of the bottom surface of the lens. The central section 230 and the outer ring 222 of the bottom lens surface are coated with a reflective coating at least at the wavelengths at which the light emitting element 210 emits.

Next, the designer selects an initial top lens surface profile that falls within the total internal reflection envelope calculated at block 310. The outer section 232 of the top surface of the optical lens 201 has a ring shape and is curved toward the bottom surface of the lens. The outer section 232 also passes light coming from a more direct angle that had previously been reflected off both the central reflective surface 230 and then the bottom reflective surface 222. Thus, the outer section 232 should not obscure the exit path for light from the light emitting element 210. The outer section 232 can be coated with an antireflective coating at least at the wavelengths at which the light emitting element 210 emits or it can remain untreated for a less efficient implementation. The edge of the outer section 232 of the top surface of the lens is coupled to the edge of the outer section 222 of the bottom surface of the lens.

An initial bottom lens surface 220, 222 profile is also selected by the designer for ray path calculations through the lens. The bottom surface of the optical lens 201 has a central section 220 that is curved inward in order to make room for a light emitting element 210 that emits into a large solid angle. Multiple light emitting elements 210 can be placed beneath the inward curving central section 220. In one embodiment, the light emitting elements are placed in a single cavity beneath a hemispherical central section. In one embodiment, each light emitting element or each cluster of light emitting elements are placed in one of multiple smaller cavities within the central section. For example, each light emitting element can be placed beneath its own concave downward section that covers the light emitting element totally or partially. In one embodiment, the central section 220 can have a large concave downward shape, while additional smaller concave downward shapes are embedded into the larger shape, where the smaller concave shapes do not fully cover each individual light emitting element.

Whether the central section 220 is comprised of multiple cavities or a single cavity, in one embodiment, the cavity or cavities can be filled with an index matching material in which the light emitting sources are embedded. The index matching material can be, but is not limited to, gels, elastomers, resins, and silicones, where the index of the material is substantially matched to the lens material. Using the index matching material minimizes refraction of the light that occurs at the input surface of the lens, thus resulting in more direct imaging of the light emitting sources from each facet projection.

The central section 220 receives light emitted by the source 210 and can be coated with an antireflective coating at least at the wavelengths emitted by the source 210. The antireflective coating may have one or more different layers. The antireflective coating can be the same as the antireflective coating on the outer ring 232 of the top surface of the lens. The outer ring 222 of the bottom lens is coated to be reflective at least at the wavelengths emitted by the source 210. The reflective coating on the outer ring section 222 of the bottom surface of the lens can be the same as the reflective coating on the central section 230. In one embodiment, a reflective coating material, such as silver, aluminum, enhanced aluminum, or gold, can be applied by a process including, but not limited to, physical vapor deposition, dipping processes, electron beam deposition, and sputtering. Other reflective coating materials can also be used.

After the initial surface profiles for the top and bottom surfaces are selected, the designer selects the desired angle of the exit beam, an angle between zero and 60 degrees.

At block 320, the system calculates ray paths from the point light source 210 that reflect off the top surface of the lens 230, 232 back into the lens, either as a consequence of the reflective coating on the central portion 230 or from total internal reflection at the outer ring 232. These reflected light rays will hit the bottom surface 222 of the lens, and the system will reflect the rays from the bottom surface. The light rays can bounce within the lens multiple times between the top surface of the lens and the bottom surface of the lens before finally exiting the outer ring 232 of the top surface of the lens.

Two example light rays are shown in FIG. 2 as they travel through the lens. The light ray 240 reflects off the central mirrored section 230 of the top surface of the lens at point A, reflects a second time off the outer section 222 of the bottom mirrored surface of the lens at point B, and then exits the lens through the outer section 232 of the top surface of the lens at point C. The light ray 250 is emitted by the light emitting element 210 and enters the lens 201 through the central section 220 of the bottom surface of the lens. The light ray strikes at a large enough angle at the outer section 232 of the top surface of the lens at point E that it is totally internally reflected back into the lens 201. It subsequently strikes the outer section 222 of the bottom mirrored surface at point F and is reflected back up through the lens 201 to strike point D of the top surface. Upon exiting the lens, the light is focused so that the light travels parallel to the light that exits the lens at point C.

At decision block 325, the system determines if the selected beam angle has been met with the selected top and bottom lens surfaces. If the desired beam angle has not been achieved with the selected lens surfaces (block 325-No), at block 335 the system adjusts the bottom lens surface, optionally with input from the designer, and returns to block 320 to recalculate the ray paths through the new lens configuration.

If the desired beam angle has been achieved with the selected lens design (block 325-Yes), at decision block 330, the system determines if the following design criteria have been met using the point source: the full solid angle of light emitted by the multiple LEDs has been captured and the design is flexible enough to meet the range of beam angles from zero to 60. If the point source design criteria have not been met (block 330-No), at block 345 the top lens surface is adjusted by the system using a spline parametric control handle. The process then returns to block 320 to recalculate ray paths through the new lens design.

If the point source design criteria have been met (block 330-Yes), at block 340 the system runs simulations using real light source models. In one embodiment, when multiple light emitting elements such as LEDs are used, the lens 201 can be made with a larger diameter. In one embodiment, the diameter of the lens can be made equal to that of a full face typical PAR lamp, while still maintaining the flat dimensions of the lens 201.

Additionally, when multiple LEDs are used that emit at different wavelengths, a broadband antireflective coating can be used to cover at least the wavelengths at which the multiple LEDs emit.

The light source models can be obtained from the manufacturer of the light sources. The simulations also take into account the spacing of the light sources in the actual light source array pattern. The output of the simulations are then used to verify that the beam angle is still met. Further, the simulation minimizes the light rays reflected within the lens back into the cavity below the central portion 220 of the bottom lens surface where the LEDs are located. Light rays entering the LED cavity will be lost, thus diminishing the efficiency of the lens. If the design criteria are not met (block 350-No), the process returns to block 345 where the top lens surface is adjusted.

If the design criteria are met using multiple light sources (block 350-Yes), the process ends at block 399. At this point, the original design criteria regarding the lit appearance of the lens and sources and the uniformity of the color mixing in the far field have not been addressed. Without further lens enhancements, these criteria will not be met for multiple light sources having different colors because the individual light sources are displaced from each other.

Figure 4:
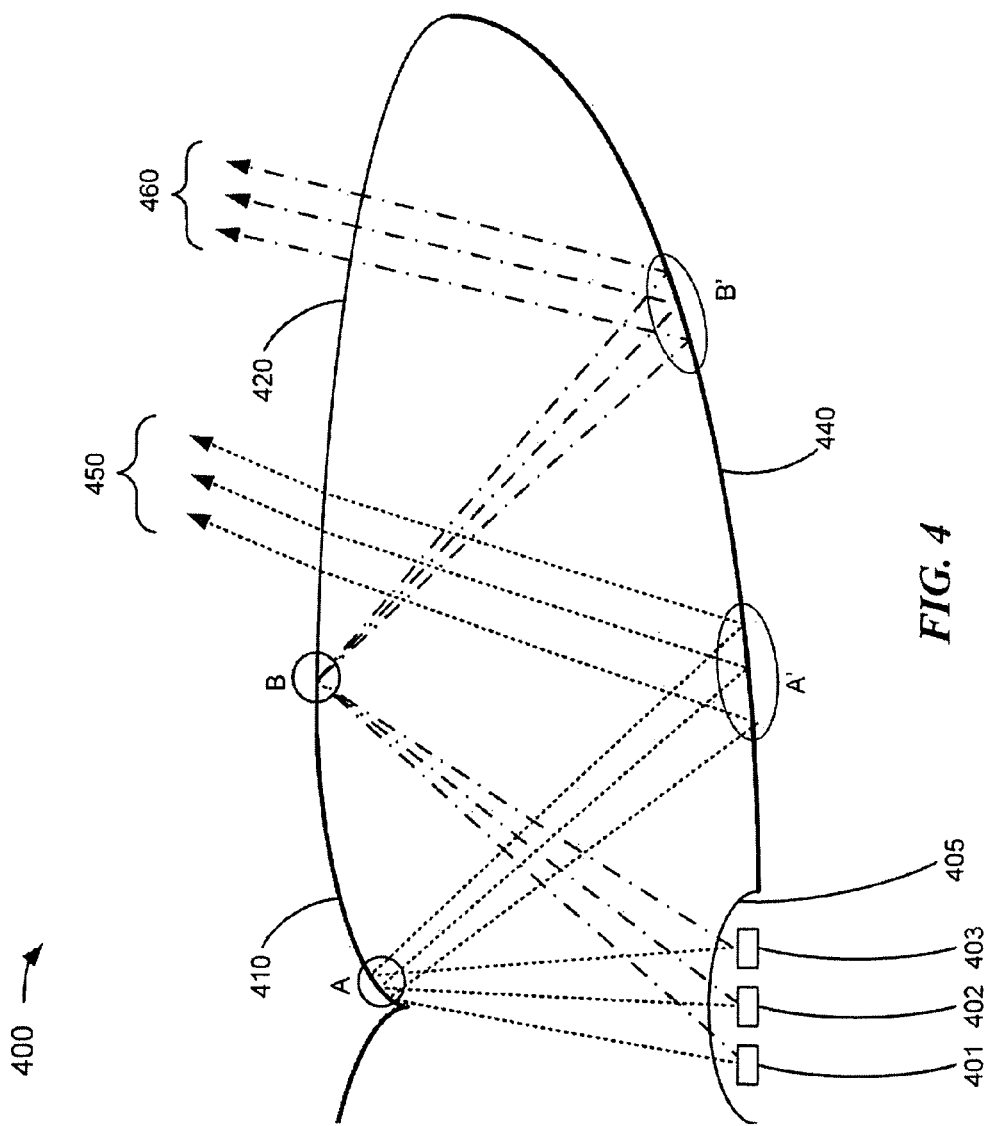
FIG. 4 shows an example of the paths taken by light rays emitted by multiple light sources into the optical lens, according to an embodiment of the disclosure.

FIG. 4 shows an example of the paths taken by rays emitted by multiple light sources into the optical lens 400. There are three light sources 401, 402, 403 shown in this embodiment; they emit light into the lens 400 through the surface 405 that can be coated with a broadband antireflective coating. Light rays from the three light sources 401, 402, 403 that strike the reflective portion 410 of the top lens surface at point A are traced through the lens. These rays strike the reflective outer ring 440 of the bottom lens surface near the area labeled A'. These rays then exit the lens through the outer ring 420 of the top lens surface, and are labeled collectively 450.

Similarly, light rays from the three light sources 401, 402, 403 that strike the outer ring 420 of the top lens surface at point B are traced through the lens. These rays strike the reflective outer ring 440 of the bottom lens surface near the area labeled B'. These rays then exit the lens through the outer ring 420 of the top lens surface, and are labeled collectively 460.

Note that because the light sources 401, 402, 403 are slightly displaced from one another, the light rays from each of these sources take slightly different paths through the lens 400 and eventually take parallel paths 450, 460 as they exit the lens. Thus, if the light sources 401, 402, 403 have different colors or peak wavelengths, the color from each light source will end up in the far field in color bands. This is in contrast to the design requirement that the lens mix the colors of the different light sources such that the far field beam pattern is uniform. One method of mixing the colors from the individual light sources is to apply facets that can scatter the reflections off of the bottom surface of the lens to effectively mix the colors.

Figure 5:
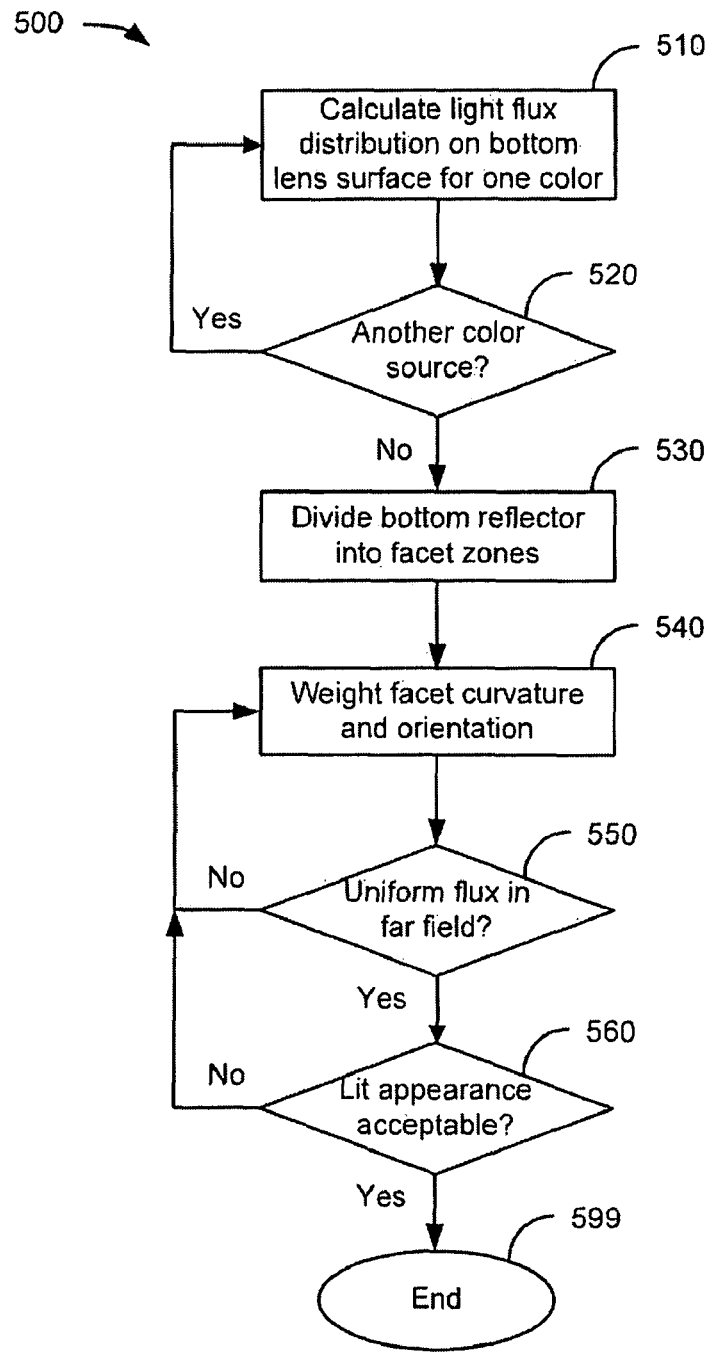
FIG. 5 depicts a flow diagram illustrating a process of designing an optical lens with facets, according to an embodiment of the disclosure.

FIG. 5 depicts a flow diagram illustrating a process 500 of designing an optical lens with facets that mixes light from different sources to produce a uniform color in the far field, according to an embodiment of the disclosure. Multiple LED light sources emitting at different wavelengths are used in order to generate light having a desired wavelength composition. These multiple sources are necessarily distributed in space because of the physical size of the LEDs.

At block 510, the system calculates the light flux distribution impinging on the outer ring 440 of the bottom lens surface for one color or peak wavelength. Then at decision block 520, the system determines if there is another color or peak wavelength present in the multiple light sources to be used for another light flux distribution calculation. If there is another color (block 520-Yes), the process returns to block 510 where the light flux distribution is calculated for another color.

Figure 6A:
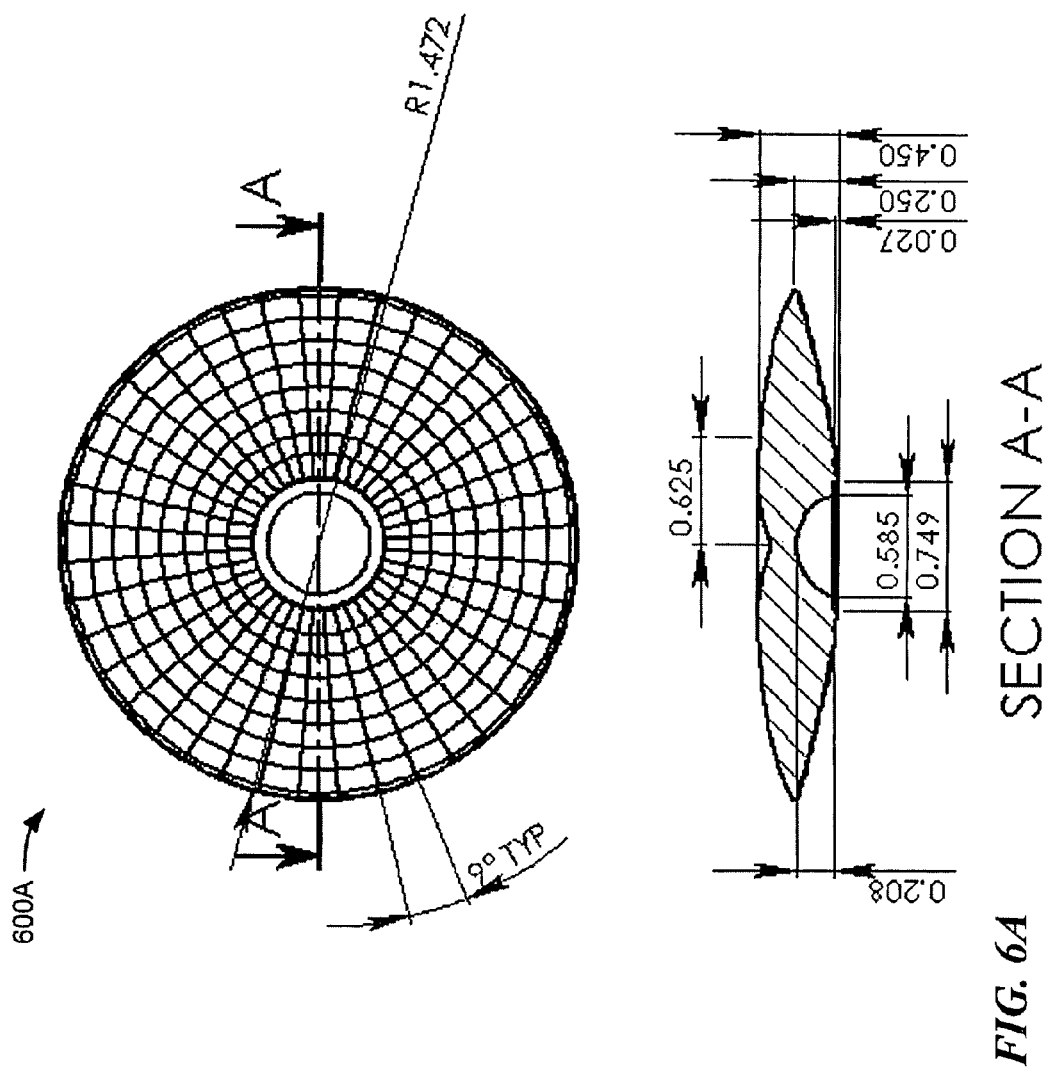
FIG. 6A shows example facet zones for an optical lens, according to an embodiment of the disclosure.

If there are no more colors present from the multiple light sources to be analyzed (block 520-No), at block 530 the bottom reflector is divided into regions called facet zones. An example of facet zones 600A is shown in FIG. 6A. The dimensions are given in inches. The outer ring 440 of the bottom lens surface is essentially a disk when viewed from above, and the disk is broken down into rings and sectors for each of the rings. In the example facet zones 600A, eight rings are used and each sector is approximately 9 degrees. However, any number of rings and any number of sectors for each ring can be used. Additionally, each ring can have a different number of sectors.

Figure 6B:
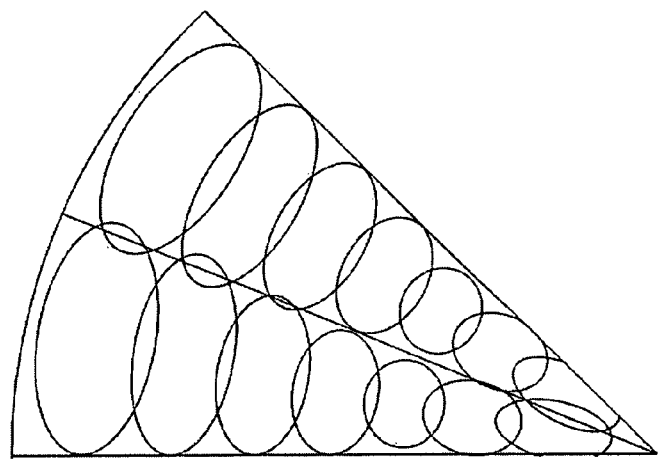
FIG. 6B shows an example of overlapping ellipsoid facets in a facet zone, according to an embodiment of the disclosure.

At block 540, the facet curvatures and facet orientations are optimized to achieve a uniform flux distribution in the far field beam pattern. In one embodiment, the facets are ellipsoidal and oriented such that the major axis is pointing in the radial direction. In one embodiment, each facet zone can have several overlapping facets. FIG. 6B shows an example of overlapping ellipsoidal facets in a facet zone. The ellipsoids overlap in both the radial and circumferential directions. The aspect ratio of the ellipsoids (ratio of major axis to minor axis) changes with radius, going from 2:1 at the center of the lens (elongated radially) to 1:2 on the outside of the lens (elongated circumferentially).

Figure 6C:
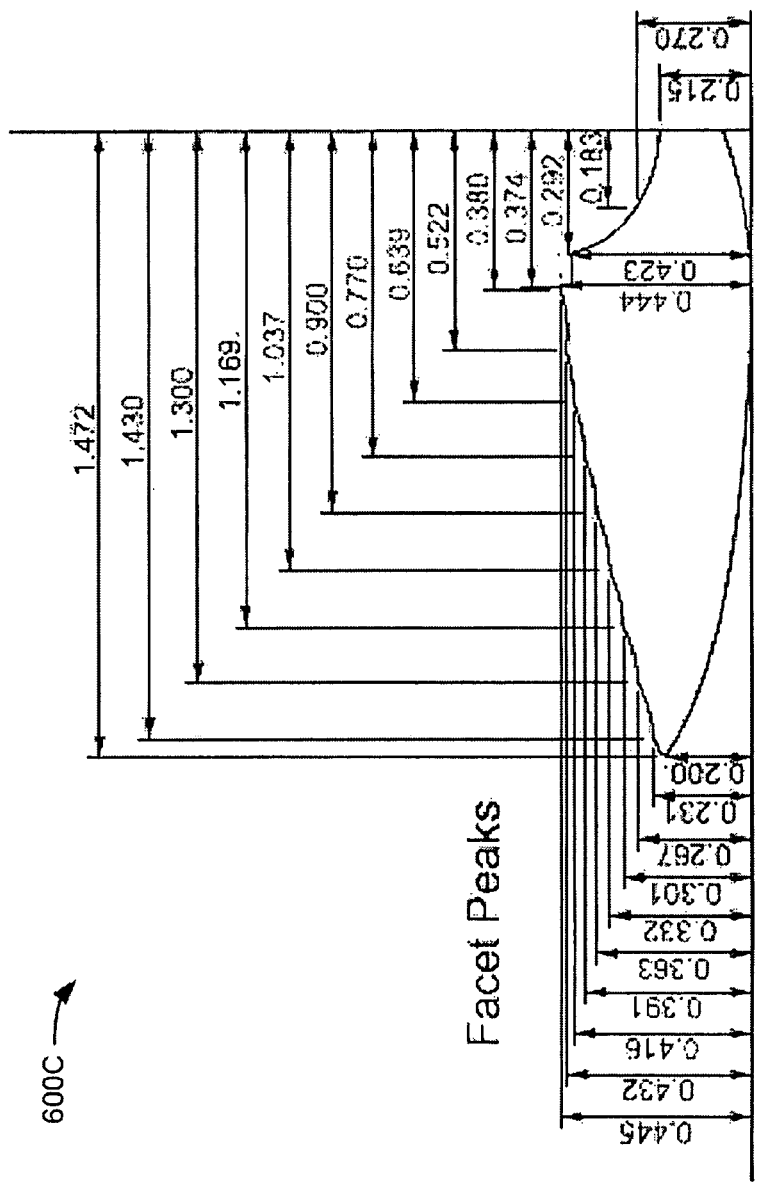
FIGS. 6C-6E show cross-sections of an optical lens with facets, according to an embodiment of the disclosure.

FIG. 6C shows a cross-section 600C of a lens with facets and the spacing between facet peaks for one embodiment. The surface referred to above as the bottom lens surface is shown as the top surface for ease of displaying the distances between facet peaks.

Figure 6D:
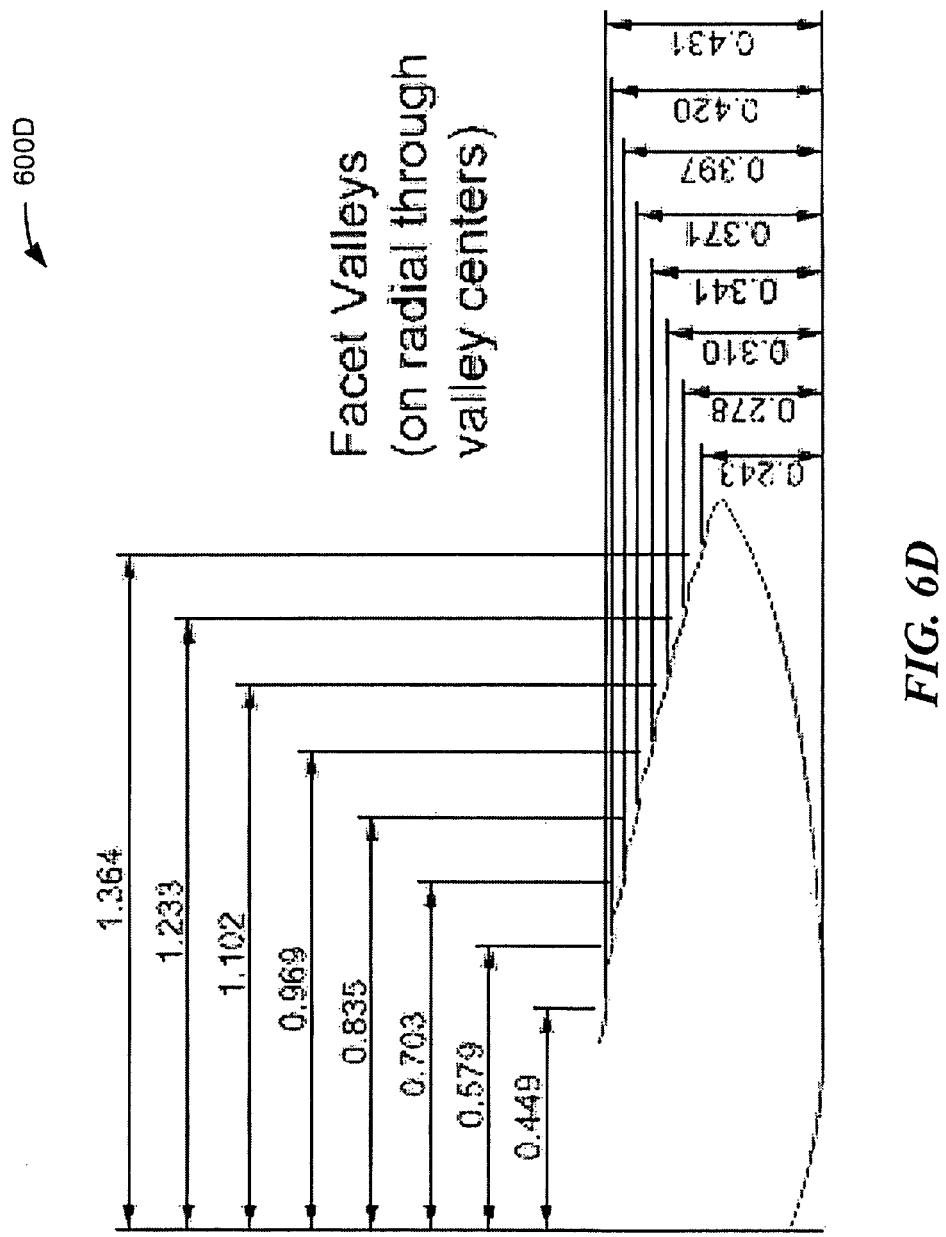

FIG. 6D shows a cross-section 600D of a lens with facets and the spacing between facet valley centers for one embodiment. Again, the surface referred to above as the bottom lens surface is shown as the top surface for ease of displaying the distances between facet peaks.

Figure 6E:
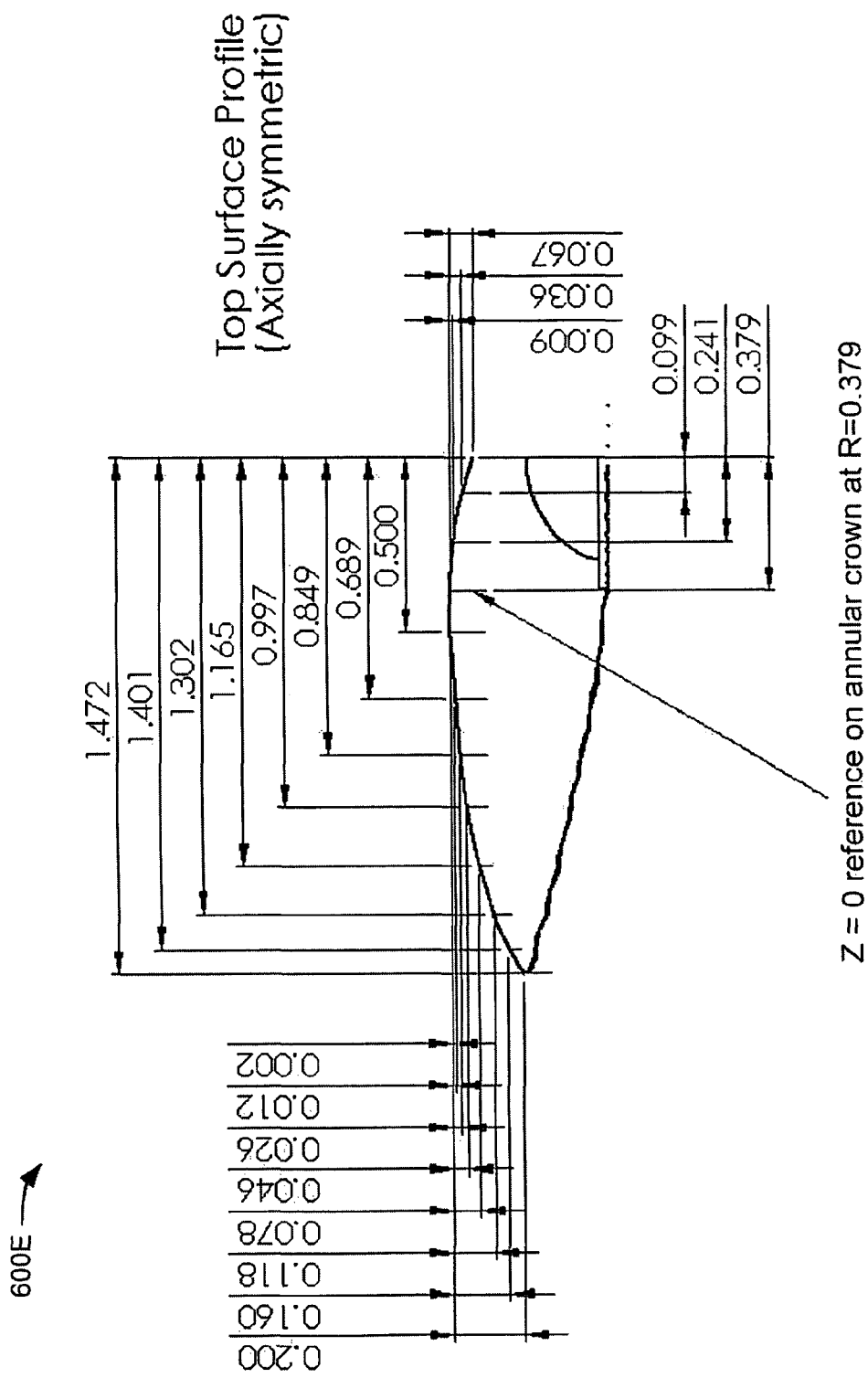

FIG. 6E shows a cross-section 600E of a lens with facets and the profile of the top surface of the lens for one embodiment. The lens is axially symmetric around a vertical axis in the center of the lens. The radial dimension of the center portion of the top lens surface 230 with respect to a central axis is 0.379 inches. In FIG. 6E, the bottom lens surface is shown as the bottom surface, in contrast to FIGS. 6D and 6E. All dimensions provided in FIGS. 6C-6E are given in inches.

With the use of the facets in the bottom lens surface, the design parameter regarding the lit appearance of the lens is fairly well met. An observer will see a uniform glow in all directions when viewing the optical lens having multiple light sources, and individual LED colors cannot be distinguished. Some residual slight chromaticity variations may still be present, but for high brightness LED sources, where the human eye reaches color saturation, an observer should be unable to distinguish these non-uniformities. For example, for source brightness in the range from approximately 100,000 candela/meter$^2$ to approximately 1,000,000 candela/meter$^2$, the lit appearance output colors should appear white to an observer.

Figure 7A:
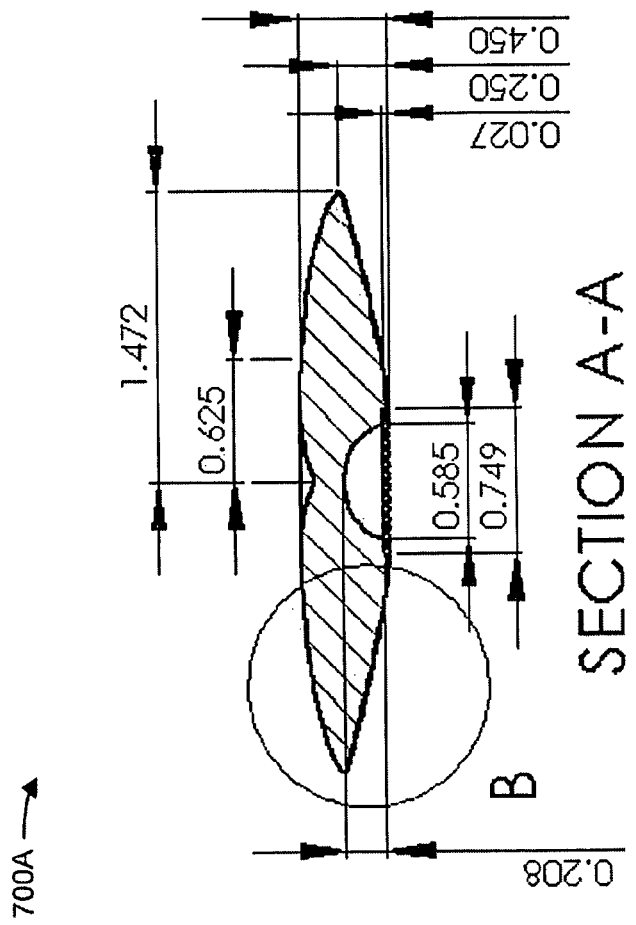
FIGS. 7A-7B show cross-sections of an optical lens with facets, according to an embodiment of the disclosure.
Figure 7B:
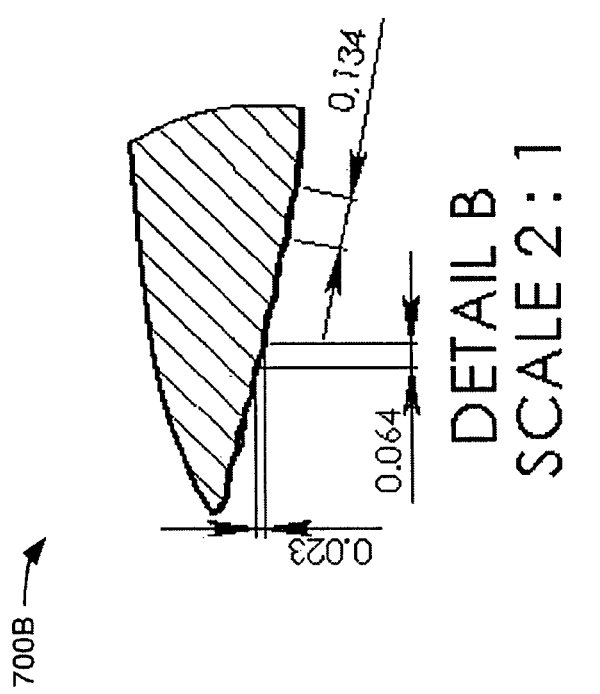

FIG. 7A depicts a cross-section of an optical lens having facets in the bottom lens surface with dimensions (in inches) according to an embodiment of the disclosure. FIG. 7A is an enlarged version of the figure at the bottom of FIG. 6A. The radius of the optical lens at its widest point is 1.472 inches; the diameter of the cavity housing the multiple light sources is 0.585 inches, and the thickness of the optical lens at its thickest point is 0.450 inches. The portion of the lens encircled on the left side of the figure and labeled "B" is shown in greater detail in FIG. 7B. In FIG. 7B, the dimensions indicate that the distance between facet peaks is 0.134 inches; the distance from the peak of a facet to a neighboring facet valley is 0.064 inches; and the depth of the facet valley is 0.023 inches.

Figure 8:
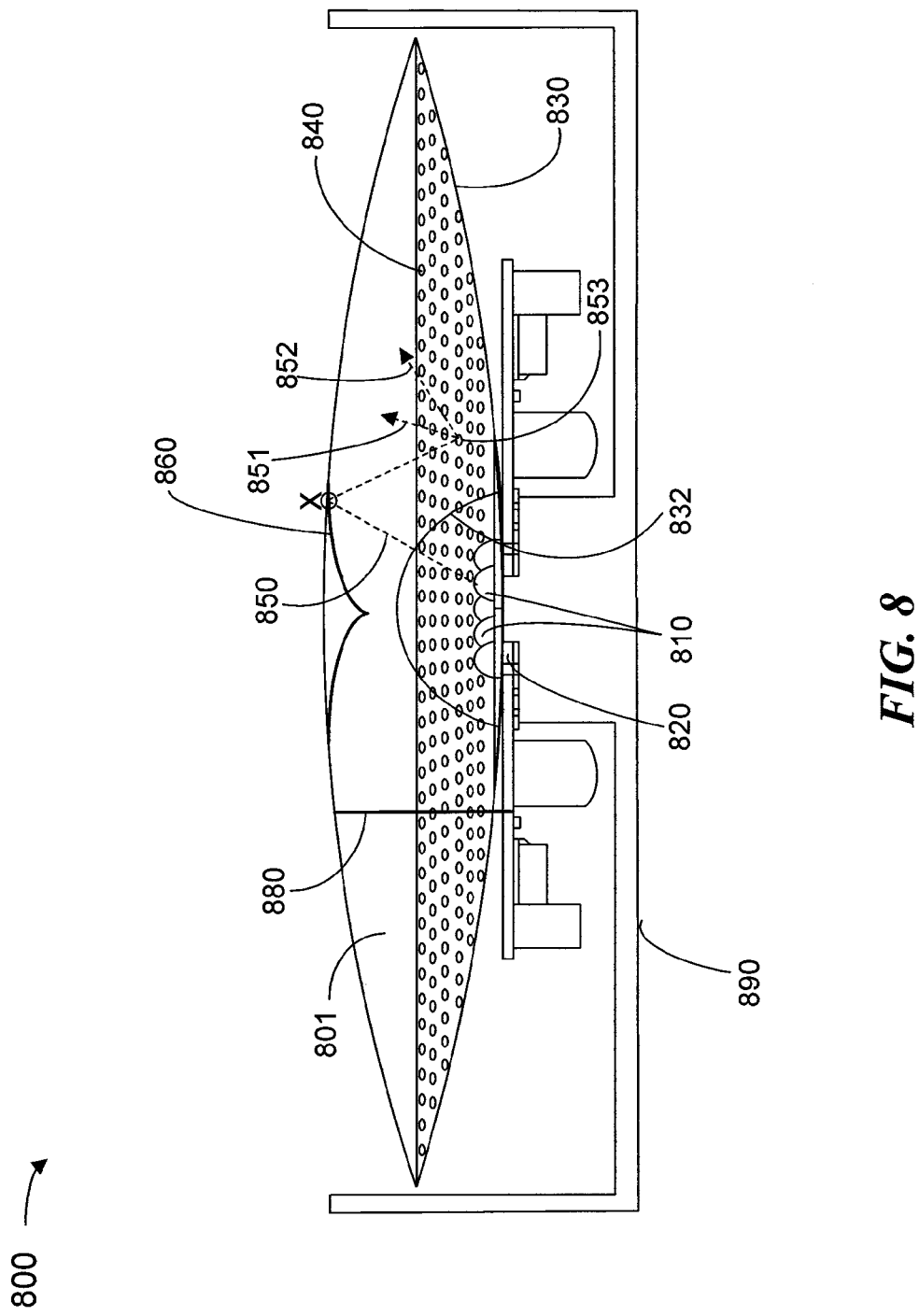
FIG. 8 depicts a side view of an example lighting device with an optical lens that has facets, according to an embodiment of the disclosure.

FIG. 8 depicts a side view of an example lighting device 800 with an optical lens 801 that has facets, according to an embodiment of the disclosure.

In one embodiment, the lens 801 with facets can be used to mix the light from multiple LEDs 810. Thus, if the LEDs have different colors, the lens 801 can effectively mix them to provide a more uniform color appearance. The outer ring 830 of the bottom surface of the lens is curved upward and has many small facets (The number of facets can be in the approximate range of 300 to 1000.) for scattering the light, where a facet is a small curved surface cut into the surface of the lens. Many shapes can be used for these individual surface cuts. For example, light ray 850 is emitted by a red LED into the lens 801 through the lens surface 832 which may be coated with an antireflection coating, as described above. The ray 850 reflects off the central section 860 of the top surface of the lens at point X and then hits the edge of a facet 853. The facet 853 then scatters the light in multiple directions, such as depicted by rays 851 and 852. With a large number of facets used for scattering the light from different color LEDs, the light that exits the top surface of the lens 801 is effectively mixed. These irregular breaks in the surface avoid mirroring the image of the light source. This mixing technique gives the lamp a lit appearance that is homogeneous in color and does not reflect the individual LED's output and color. This type of lit appearance is considered more attractive than the individual LED look particularly when deploying multicolor LEDs. Further, a diffuser can be added to this type of lens that can further blend the output light.

Although diffusers alone would not sufficiently blend the light of individual LEDs, such that the LED array look would be eliminated, by adding a diffuser to the surface of the LED cavity, light mixing from the different colored discrete LEDs can be improved. Light passing through the diffuser can smooth out the hot spots of the discrete LED sources, essentially turning the hemispherical LED cavity into a glowing orb. The diffuser effectively 'pre-mixes' the different LED colors and reduces the amount of light mixing to be performed by the facets. Consequently, the precision to which the facets should be manufactured is reduced.

The diffuser is designed to enhance color mixing without scattering any significant amount of light back into the LED cavity because that would reduce the efficiency of the lens system. The surface of the diffuser can be sawtoothed or scalloped such that the period and depth of the structures are controllable. As a result, the diffuser performs as if it has a large number of embedded micro-lenses.

The diffuser surface can be manufactured using several different techniques. In one embodiment, a suitable texture is applied to the hemispherical portion of a lens mold. Then through a die-casting process using the mold, lenses can be manufactured that have the proper diffuser structure on the central portion 220 of the bottom of the lens above the LED cavity.

In one embodiment, a separate thin-shelled transparent hemisphere can be manufactured having the requisite structure on its inner surface. The thin-shelled hemisphere is then bonded inside the hemispherical lens cavity 220 using optical cement that is index-matched to the lens. Multiple thin-shelled hemispheres, each having a different texture, can be stacked to achieve unique diffuser characteristics that are not possible with a single texture. Each of the different textures of the thin-shelled hemispheres corresponds to a periodic structure.

In one embodiment, ground glass particles or powdered glass can be deposited on an adhesive substrate that is either molded in place or attached with optical cement. Then the size of the glass particles and the density of glass particles per unit area controls the period of the structure, while the particle size controls the depth.

Also shown in FIG. 8 is an electronics board 820 on which the LEDs are mounted. The electrical connections through which the LEDs or other lighting elements are powered are supplied through the board 820.

The optical lens can be made of any material that transmits light at the wavelengths at which the light emitting elements emit including, but not limited to, optical grade acrylic such as poly(methyl methacrylate) (PMMA), glass, polycarbonate, cyclic olefin co-polymer (COC). The higher the transmission of light through the lens material, the higher the efficiency of the lens.

Vapor deposited or dip processed silver or other dielectric reflective coatings that are sealed on surfaces 222 and 230 can achieve reflectivities of around 98%, and the antireflective coatings on surfaces 220 and 232, if employed, can achieve greater than approximately 98% transmission, thus resulting in a highly efficient optical lens, greater than approximately 95% transmission efficiency. Further, unlike a traditional reflector, the optical lens 100 and 200 is a single piece and can be made quite compactly and at a low cost.

The top and bottom reflecting surfaces can also be molded into the surface of the lens by using retroreflector technology. Retroreflectors comprised of repeating ridges of 90-degree corner structures can be used, where the retroreflectors sweep radially outward such that the ridges grow as the radius increases. An example of a section of corner reflector retroreflectors is depicted in FIG. 2A. FIG. 2A is a sectional view of the reflective lens surface 222, taken along lines A-A of FIG. 2. Each triangle in the sectional view represents the aperture of a trihedral 229 of one corner reflector on the surface 222, where the center of a triangle is the corner of the corner reflector. Alternatively or additionally, more ridges are can be inserted at larger radii. The ridges are formed on the surface of the lens and are oriented radially to reflect incident light. In one embodiment, the ridges can be tuned with flat surfaces to allow some controlled light emission near the top center of the lens.

As described above, different reflective materials can be applied using various application techniques, such as deposition and sputtering. However, this type of radial retroreflector technology is particularly advantageous for the small reflective top lens surface because it can be molded into the lens without using the masking and coating processes needed to deposit a reflective surface that only partially covers the lens surface. Additionally, if retroreflectors are used on the bottom surface of the lens, a reflective coating or cover can be used to prevent loss of downward light emissions into the LED cavity, thus improving efficiency. An extended sheet of pressed reflective material, such as a silver or gold sheet, can be pressed onto the bottom surface of the retroreflector ridges.

In addition to providing a reflective surface, the retroreflector ridges can also provide mixing of the light from the sources. For example, patches of retroreflector ridges can be inclined with respect to other patches of retroreflector ridges such that light in the far field can be tilted radially and/or skewed at an angle from the optical axis of the lens. The size and shape of the retroreflector ridge patches can vary. In one embodiment, retroreflectors used on the bottom surface can be set to angles that are not at 90 degrees to diverge the light rays incident upon the ridges. Localized sub-sections of the retroreflector surface can have ridges set to a particular angle, in a manner similar to the facets described above.

In one embodiment, the surfaces 222, 230 that have a reflective surface deposited upon them can be sealed with a clear coating to prevent corrosion of the surface. Alternatively, the entire top and bottom surfaces of the lens can be coated with a clear coating for ease of application of the coating.

A diffuser can also be used at the exit of the lens to further blend the light. In this case, the diffuser becomes part of the light path, and light leaving the lens can bounce off the diffuser and back off the top surface of the lens. Thus, using a protective coating made from a suitable antireflection material can minimize reflections, resulting in a higher efficiency lens, as well as a lens protector. If retroreflectors are used for the reflecting top surface of the lens, the diffuser serves the additional function of preventing dust from falling onto the radial retroreflectors.

As described above, the optical lens can be used in conjunction with multiple LED light sources. In one embodiment, a remote control can be used for functions including, but not limited to, adjusting the color balance of the light emitted by the light sources, dimming the light sources, and generating a unique lamp identification. Signals from the remote control are received by an antenna coupled to the LED light sources below the lens. In order to maintain the design criteria that the lens is compact and has a low volume, the antenna can be embedded inside the lens, either vertically or at an angle. Example characteristics for the antenna are that it is made from copper, is made from 32 gauge wire, and is approximately 0.75 inches long. A person skilled in the art will recognize that an antenna can be constructed from other suitable materials having alternative dimensions.

In one embodiment, the antenna is oriented vertically. The top of the antenna is flush with the top surface of the lens, and it is located about halfway out radially from the center of the lens. The bottom of the antenna protrudes through the facets of the bottom lens surface and is attached to an electronics board 820. An example antenna is shown as element 880 in FIG. 8. It should be noted that the antenna can be positioned anywhere within the lens with any orientation.

An LED's performance depends strongly upon the ambient temperature of its operating environment. If the LED becomes overheated during operation, the LED's output will decrease and eventual lead to device failure. Consequently, the LED light sources and the optical lens can be packaged in a thermally conductive housing (shown as element 890 in FIG. 8), such as a canister, in order to conduct heat away from the LEDs more rapidly. Heat can be conducted away from the LEDs using either ambient air or with an external source, such as a fan.

Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while an optical lens used for capturing light from LEDs is mentioned, the optical lens can be used with any light emitting element under the principles disclosed herein. Further any specific numbers noted herein are only examples: alternative implementations may employ differing values or ranges.

The teachings of the invention provided herein can be applied to other systems, not necessarily the system described above. The elements and acts of the various embodiments described above can be combined to provide further embodiments.

While the above description describes certain embodiments of the invention, and describes the best mode contemplated, no matter how detailed the above appears in text, the invention can be practiced in many ways. Details of the system may vary considerably in its implementation details, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

We claim:

1. An optical lens, comprising:
  a light transmissible body;
  a first surface of the light transmissible body having a first outer ring section and a first central section, wherein the first central section is curved inward, the first outer ring section is reflective, and the first outer ring section is curved towards a second surface;
  the second surface of the light transmissible body having a second outer ring section and a second central section, wherein the second central section has an inwardly tapered notch in the center, the second central section is reflective, the second outer ring section is curved towards the first surface, and an edge of the second surface is coupled to an edge of the first surface;
  wherein the first central section receives light emitted by a plurality of light emitting elements, the plurality of light emitting elements emit at least at different peak wavelengths, and the light exits the lens through the second outer ring section, and further wherein in the far field, the light has a substantially uniform color, and
  further wherein a second curvature of the second outer ring section causes light rays emitted directly from the plurality of light emitting elements that strike the second outer ring to be substantially totally internally reflected back into the optical lens and reflected from the first outer ring section, and a first curvature of the first outer ring section causes light exiting the optical lens to have a predetermined divergence angle with respect to an optical axis of the lens.

2. The optical lens of claim 1 wherein the first surface and the second surface are circularly symmetrical about the optical axis.

3. The optical lens of claim 1 wherein the first central section is coated with an antireflective coating at least at wavelengths of light emitted by the plurality of light emitting elements.

4. The optical lens of claim 1 wherein the second outer ring section is coated with an antireflective coating at least at wavelengths of light emitted by the plurality of light emitting elements.

5. The optical lens of claim 1 wherein the first outer ring section and the second central section are coated with a reflective coating and a protective coating.

6. The optical lens of claim 1 wherein the first outer ring section is configured to be reflective with retroreflectors.

7. The optical lens of claim 1 wherein the second central section is configured to be reflective with retroreflectors.

8. The optical lens of claim 1 wherein the light emitting elements are light emitting diodes.

9. The optical lens of claim 1 wherein the optical lens is covered with a clear protective coating.

10. The optical lens of claim 1, further comprising a diffuser coupled to the first central section of the first surface.

11. The optical lens of claim 10 wherein the diffuser comprises an optical material having a periodic structure.

12. The optical lens of claim 10 wherein the diffuser comprises one or more shells, and further wherein the shells each have a different periodic structure.

13. The optical lens of claim 1 wherein multiple concave downward cavities are embedded within the first central section that is curved inward.

14. A lighting device comprising:
  a plurality of light emitting diodes that emit light having at least two different wavelength peaks;
  an electronics board to provide power to the plurality of light emitting diodes;
  a lens configured to capture the light emitted by the plurality of light emitting diodes, wherein the lens comprises:
    a light transmissible body;
    a first surface of the light transmissible body having a first outer ring section and a first central section, wherein the first central section is curved inward to accommodate the plurality of light emitting diodes, the first outer ring section is reflective, and the first outer ring section is curved towards a second surface;
    the second surface of the light transmissible body having a second outer ring section and a second central section, wherein the second central section has an inwardly tapered notch in the center, the second central section is reflective, the second outer ring section is curved towards the first surface, and an edge of the second surface is coupled to an edge of the first surface;
  wherein the first central section receives light emitted by the plurality of light emitting elements, the second central section and the first outer ring section are coated with a reflective coating at least at wavelengths of light emitted by the plurality of light emitting diodes, and the light exits the lens through the second outer ring section, and further wherein in the far field, the light has a substantially uniform color, and
  further wherein a curvature of the second out ring causes rays emitted directly from the plurality of light emitting elements that strike the second outer ring to be substantially totally internally reflected back into the optical lens and reflected from the first outer ring section, and a first curvature of the first outer ring section causes light exiting the optical lens to have a predetermined divergence angle with respect to an optical axis of the lens.

15. The lighting device of claim 14, further comprising a first diffuser coupled to the second surface to blend light exiting the lens.

16. The lighting device of claim 14, further comprising a thermally conductive housing for conducting heat away from the plurality of light emitting diodes.

17. The lighting device of claim 14 wherein the first central section and the second outer ring section are coated with an antireflective coating at least at wavelengths of light emitted by the plurality of light emitting diodes.

18. The lighting device of claim 14 wherein the first outer ring section and the second central section are coated with a reflective coating and a protective coating.

19. The optical lens of claim 14 wherein the first outer ring section is configured to be reflective with retroreflectors.

20. The optical lens of claim 14 wherein the second central section is configured to be reflective with retroreflectors.

21. The optical lens of claim 14 wherein the optical lens is covered with a clear protective coating.

22. The optical lens of claim 14, further comprising a second diffuser coupled to the first central section of the first surface.

23. The optical lens of claim 22 wherein the diffuser comprises an optical material having a periodic structure.

24. The optical lens of claim 14 wherein multiple concave downward cavities are embedded within the first central section that is curved inward.

25. An optical lens, comprising:
- a first surface having a first outer ring section and a first central section, wherein the first central section is curved inward, the first outer ring section is reflective, and the first outer ring section is curved towards a second surface;
- the second surface having a second outer ring section and a second central section, wherein the second central section has an inwardly tapered notch in the center, the second central section is reflective, the second outer ring section is curved towards the first surface, and an edge of the second surface is coupled to an edge of the first surface,
- wherein the first central section receives light emitted by a plurality of light emitting elements, the plurality of light emitting elements emit at least at different peak wavelengths, and the light exits the lens through the second outer ring section, and further wherein in the far field, the light has a substantially uniform color;
- an antenna embedded into the lens for receiving signals to control the plurality of light emitting diodes.

26. An optical lens, comprising:
- a light transmissible body;
- a first surface of the light transmissible body having a reflective first outer ring section and a first central section, wherein the first outer ring section is curved towards a second surface;
- the second surface of the light transmissible body having a second outer ring section, and a reflective second central section, wherein the second outer ring section is curved towards the first surface;
- wherein light entering the optical lens through the first central section exits the optical lens through the second outer ring section, and
- further wherein a second curvature of the second outer ring section causes light rays entering the optical lens that directly strike the second outer ring to be substantially totally internally reflected back into the optical lens and reflected from the first outer ring section, and a first curvature of the first outer ring section causes light exiting the optical lens to have a predetermined divergence angle with respect to an optical axis of the lens.

27. The optical lens of claim 26 wherein the first surface and the second surface are circularly symmetrical about the optical axis.

28. The optical lens of claim 26 wherein the first central section is coated with an antireflective coating at least at one of the wavelengths of light entering the lens.

29. The optical lens of claim 26 wherein the second outer ring section is coated with an antireflective coating at least at one of the wavelengths of light entering the lens.

30. The optical lens of claim 26 wherein the first outer ring section and the second central section are coated with a reflective coating and a protective coating.

31. The optical lens of claim 26 wherein the light entering the lens is emitted by a plurality of light emitting diodes.

32. The optical lens of claim 26 wherein the optical lens is covered with a clear protective coating.

* * * * *